(12) United States Patent
Voss et al.

(10) Patent No.: US 10,134,927 B2
(45) Date of Patent: Nov. 20, 2018

(54) RELIABLE ELECTRICAL CONTACTS FOR HIGH POWER PHOTOCONDUCTIVE SWITCHES

(71) Applicant: Lawrence Livermore National Security, LLC, Livermore, CA (US)

(72) Inventors: Lars Voss, Livermore, CA (US); Mihail Bora, Livermore, CA (US); George Caporaso, Livermore, CA (US); Adam Conway, Livermore, CA (US); Hoang T. Nguyen, Livermore, CA (US); Rebecca J. Nikolic, Oakland, CA (US); Stephen E. Sampayan, Manteca, CA (US); Sangtae Park, San Ramon, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 222 days.

(21) Appl. No.: 15/206,133

(22) Filed: Jul. 8, 2016

(65) Prior Publication Data

US 2018/0013029 A1    Jan. 11, 2018

(51) Int. Cl.

| H01J 40/14 | (2006.01) |
| H01L 31/0232 | (2014.01) |
| G02B 6/42 | (2006.01) |
| H01L 31/0312 | (2006.01) |
| H01L 31/09 | (2006.01) |

(52) U.S. Cl.
CPC ...... *H01L 31/02327* (2013.01); *G02B 6/4295* (2013.01); *H01L 31/0312* (2013.01); *H01L 31/09* (2013.01)

(58) Field of Classification Search
CPC .... H01L 31/102; H01L 31/0232; H01L 31/02
USPC ......................... 250/214.1; 257/448, 453, 463
See application file for complete search history.

(56) References Cited

U.S. PATENT DOCUMENTS

| 5,227,621 A * | 7/1993 | Kim ................. G01S 7/282 |
| | | 250/214.1 |
| 6,107,643 A * | 8/2000 | Skytt ................ H01L 31/102 |
| | | 257/450 |
| 2018/0053872 A1* | 2/2018 | Jang ................. H01L 31/1075 |

* cited by examiner

*Primary Examiner* — Kevin Pyo
(74) *Attorney, Agent, or Firm* — Perkins Coie LLP

(57) ABSTRACT

A photoconductive switch consisting of an optically actuated photoconductive material, e.g. a wide bandgap semiconductor such as SiC, situated between opposing electrodes. The electrodes are created using various methods in order to maximize reliability by reducing resistive heating, current concentrations and filamentation, and heating and ablation due to the light source. This is primarily accomplished by the configuration of the electrical contact geometry, choice of contacts metals, annealing, ion implantation, creation of recesses within the SiC, and the use of coatings to act as encapsulants and anti-reflective layers.

28 Claims, 16 Drawing Sheets

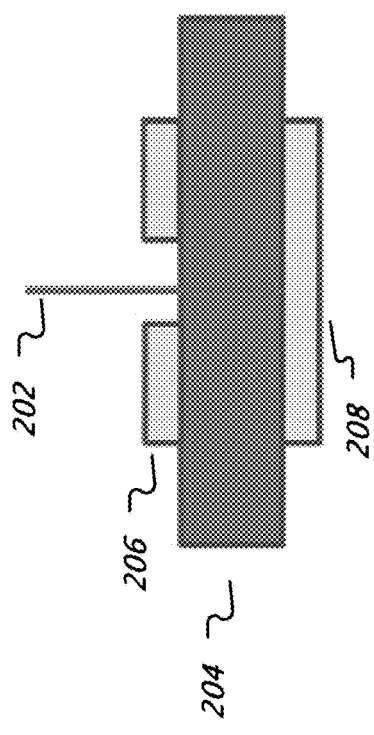
FIG. 2
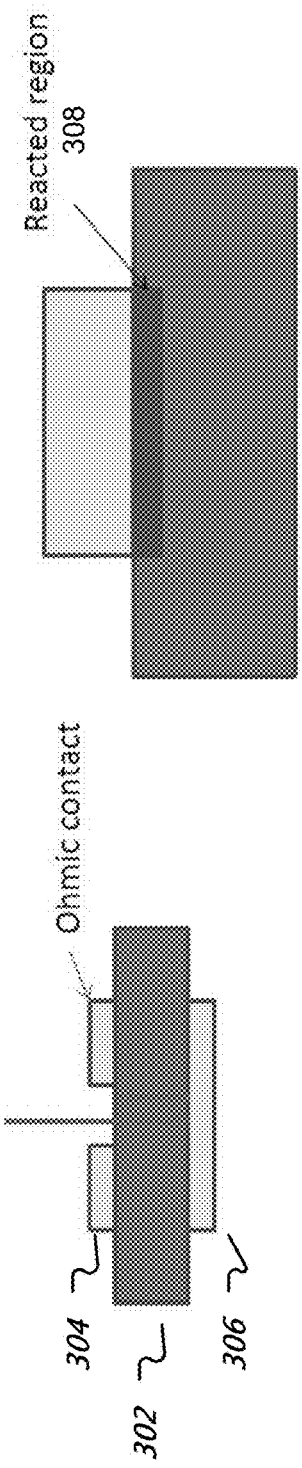
FIG. 3A
FIG. 3B

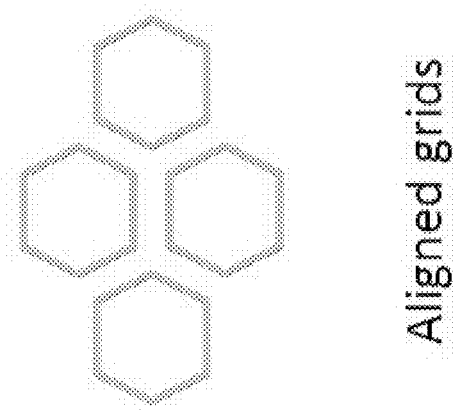
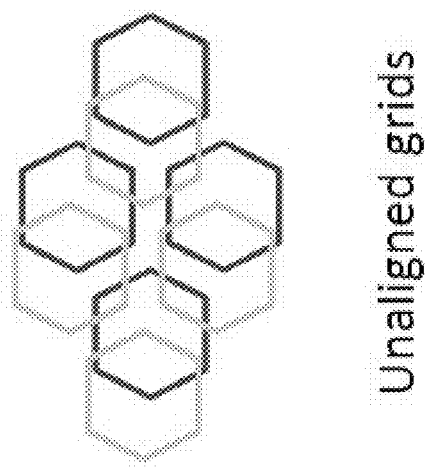
FIG. 13

Grooves with metal

Grooves in surface

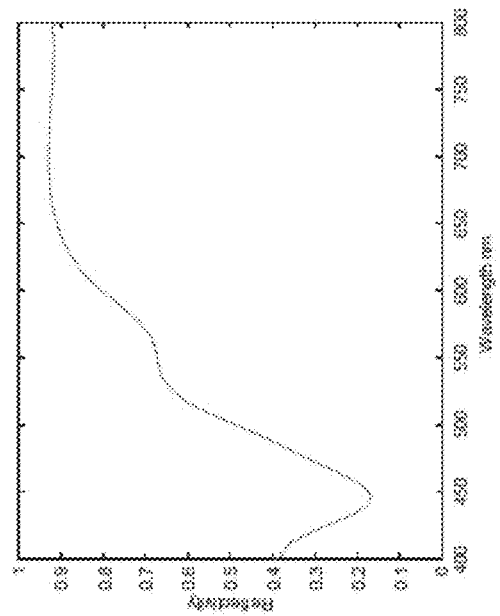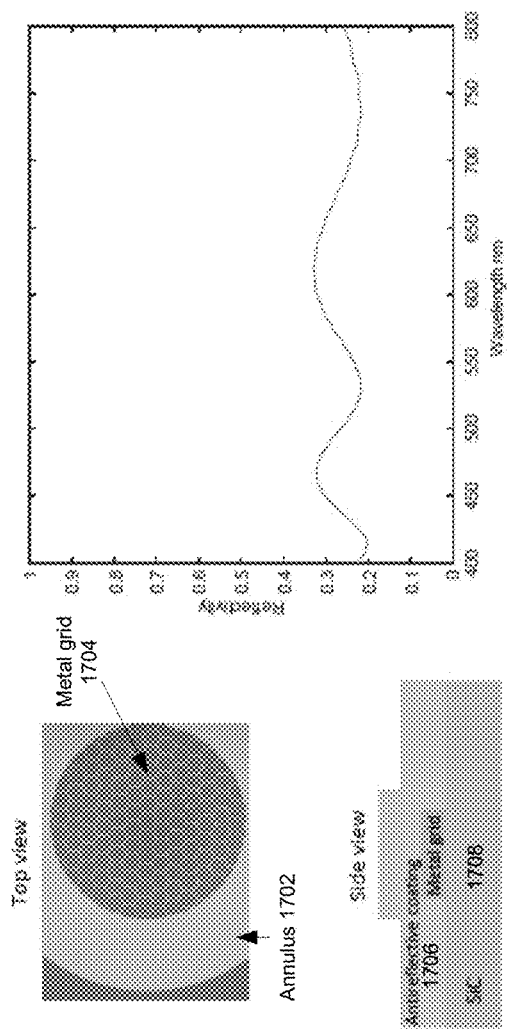
FIG. 17A  FIG. 17B  FIG. 17C  FIG. 17D

RELIABLE ELECTRICAL CONTACTS FOR HIGH POWER PHOTOCONDUCTIVE SWITCHES

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to electrical switches, high power switching, RF generation, and photoconductive switches.

BACKGROUND

Electronic circuits in most applications are based on electronic circuit elements, such as resistors, capacitors, inductors, transistors, diodes and other circuit modules including amplifiers, oscillators, and switches that are based on the above circuit elements. Such circuits can be implemented in various configurations and can be used in various applications. For example, switching circuits that turn on or off an electrical conductive path between two electrical contacts can be constructed based on the above electronic circuit elements. Photoconductive switches are required for a variety of applications including grid switching, power switching, RF generation, and others.

SUMMARY

The circuits and devices described in this patent document include photonic devices having at least two metal contacts and a photoconductive material that change electrical behaviors in response to light.

In one example aspect, an electronic device for high power photoconductive switches is disclosed. The electronic device comprises a bottom metal contact, a photoconductive material placed on the bottom metal contact, and a top metal contact placed on the photoconductive material, comprising an opening to allow light to enter from above.

In another example aspect, a high power photoconductive axial switch is disclosed. The axial switch comprises a light source to produce light; an electrical power supply to apply a high voltage when the light source is on; a top electrode located in an optical path of the light and coupled to the electrical power supply, comprising an opening to allow the light to enter from above; a photoconductive material placed under the top electrode; and a bottom electrode placed under the photoconductive material, wherein the photoconductive material exhibits an electrical conductivity that varies with a level of the light to turn on or off the electrical path between the top electrode and the bottom electrode.

BRIEF DESCRIPTION OF THE DRAWINGS

FIG. 2 shows an example configuration of an axial switch with an opening.

FIGS. 3A-3B show another example configuration of an axial switch with Ohmic contact.

FIG. 13 shows a comparison of two different metal grid configurations in which top and bottom metal grids are shifted and aligned.

FIGS. 17A-17B show example configurations of the photoconductive switch that includes a dielectric multi-layer coating.

FIGS. 17C-17D show example plots of reflectivity versus wavelength related to the photoconductive switch.

DETAILED DESCRIPTION

This patent document discloses devices, systems, and methods for reliable electrical contacts for high power photoconductive switches. The disclosed technology can improve the architecture of the electrical contacts and the switch to drastically improve reliability and performance relative to prior structures.

Figure 1:
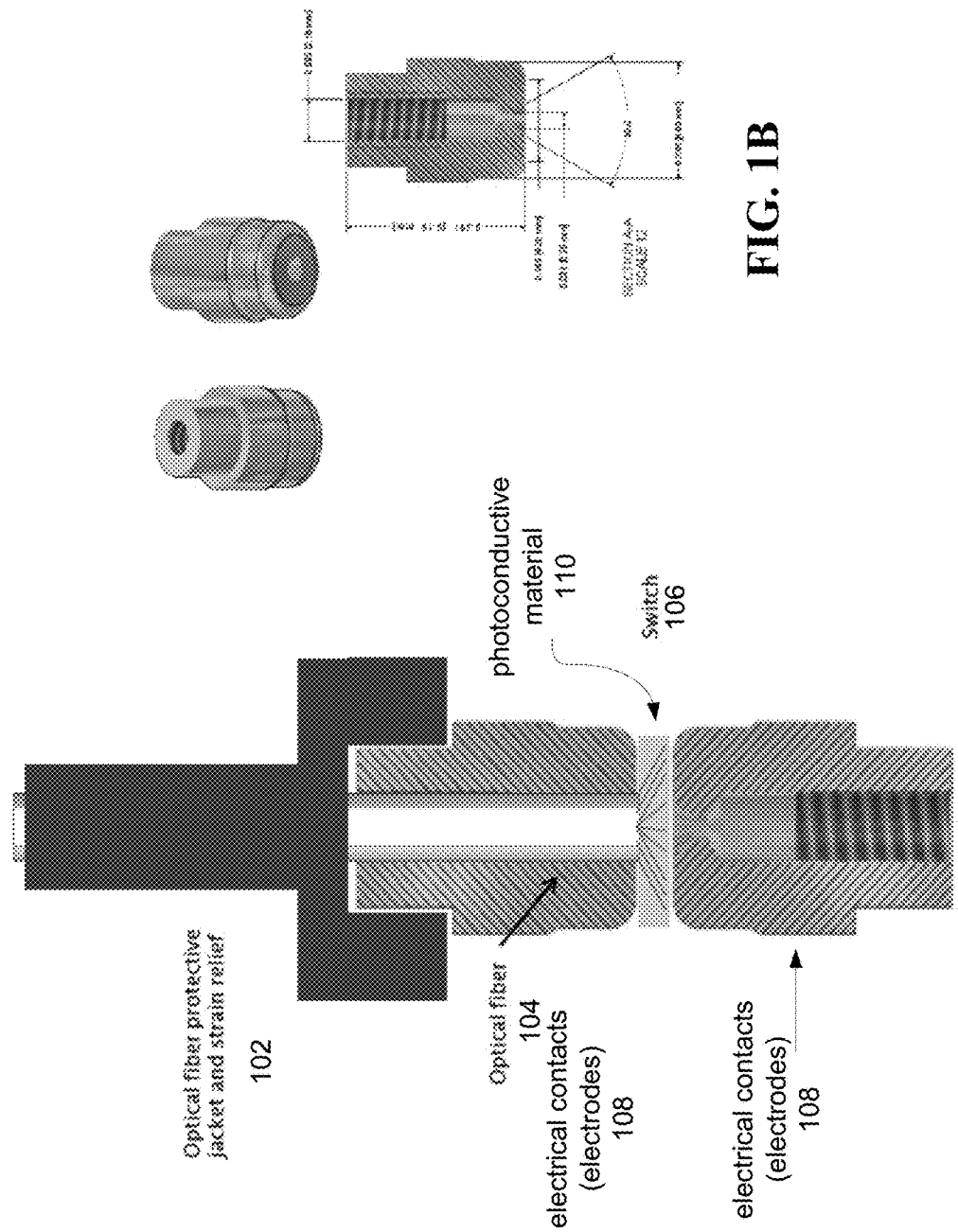
FIG. 1A shows a photoconductive switch is situated between opposing electrodes having an optical fiber going through the center.
FIG. 1B demonstrates an example electrode configuration with threaded hole through center for mounting.

FIGS. 1A-1B show a cross-sectional view of the basic components of a photoconductive axial switch. In FIG. 1A, a photoconductive switch 106 is situated between opposing electrodes having an optical fiber 104 going through the center. The optical fiber is further protected using an optical fiber protective jacket and train relief 102. FIG. 1B demonstrates an example electrode configuration with threaded hole through center for mounting. The two electrodes (sometimes referred to as top and bottom electrodes) allow a potential difference to be established across the photoconductive switch. Upon illumination of the photoconductive material with light of appropriate characteristics (e.g., suitable wavelength, intensity, etc.) the photoconductive switch is activated, allowing current to flow between the top and bottom electrodes. In the configuration of FIG. 1A and the remaining figure of this patent document, for illustration purposes, the light source is depicted as illuminating the photoconductive switch from the top. However, it is understood that, in some implementation, the light source can be positioned to illuminate the photoconductive switch from the bottom, or from both the top and bottom.

One of the objectives of axial switch configuration is to allow an optical beam to be coupled to the photoconductive material from the top or the bottom section of the switch. In some implementations, to minimize the active area and reduce laser output requirements, the baseline switch geometry can be selected to be a disk and not a square. The active material can end exactly at the electrode triple junction (i.e., at the electrode-photoconductive material-air/vacuum junction). Other features can include utilizing same diameter electrodes, e.g. 4 mm.

As illustrated in FIG. 1A, in an axial switch, electrical contacts 108 are formed on opposing sides of a photoconductive material 110. A light source is used to shine through the center of the contacts to excite electrons and holes within the material and increase the conductivity and cause the flow of a large current when the light source is on. The electrical contacts are configured in such a way as to reduce degradation of both the electrical contacts and the photoconductive material due to the large power dissipation arising from both current flow and heating from the light source.

FIG. 2 shows a side view of an example configuration of an axial switch. The switch comprises a SiC substrate 204 and two metal contacts 206 and 208. The top metal contact 206 comprises an opening such that the light 202 can enter the switch unimpeded from the top side. In some embodiments, the opening can be a circle, e.g. the top metal contact forms an annulus or doughnut shaped electrode. In some other embodiments, the opening can be a square or another suitable shape. In some example implementations, the area of the entire axial switch covers about 1-4 $cm^2$. The diameter of the opening is between 1 mm and 17 mm while the outer diameter of the top metal contact is several mm larger than the diameter of the opening. The thickness of the SiC substrate, in one example implementation, is between 100 µm to several mm.

FIGS. 3A-3B show another example configuration of an axial switch. In FIG. 3A, top metal contact 304 comprises metals that form an Ohmic contact for the SiC substrate 302 in order to reduce heating due to contact resistance. Metals may be annealed at high temperature to form the Ohmic contact. For example, Ni or Ti can be annealed at temperatures higher than 950° C. for longer than 10 seconds. Furthermore, as shown in FIG. 3B, the Ohmic contact anneal can react with the SiC substrate to form a reacted region 308, acting as a quasi-3D electrode. This quasi-3D electrode forms a larger surface area for collecting current, and thus reduces current constriction at the point where the current flows from the SiC substrate into the electrode.

Figure 4B:
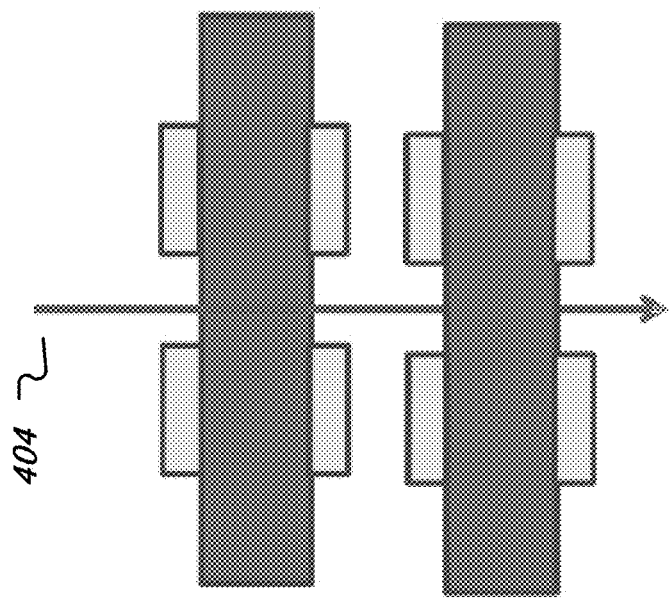
FIG. 4B shows an example configuration of stacked switches.
Figure 4A:
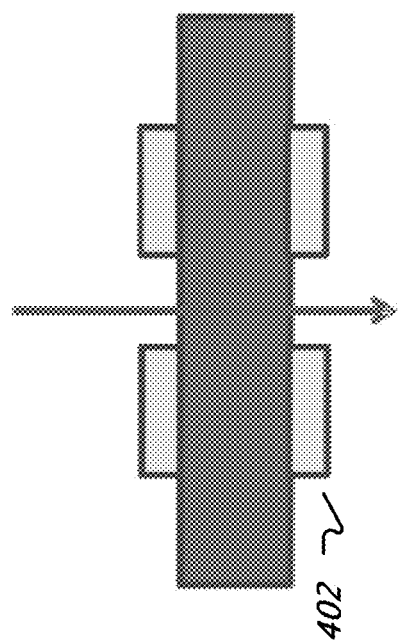
FIG. 4A illustrates the bottom metal contact having an opening.

FIGS. 4A-4B show another example configuration of an axial switch. FIG. 4A illustrates that bottom metal contact 402 can also comprise an opening such that light can exit the switch unimpeded. This configuration allows multiple switches to be stacked on top of each other and actuated with the same light source 404, as shown in FIG. 4B.

Figure 5:
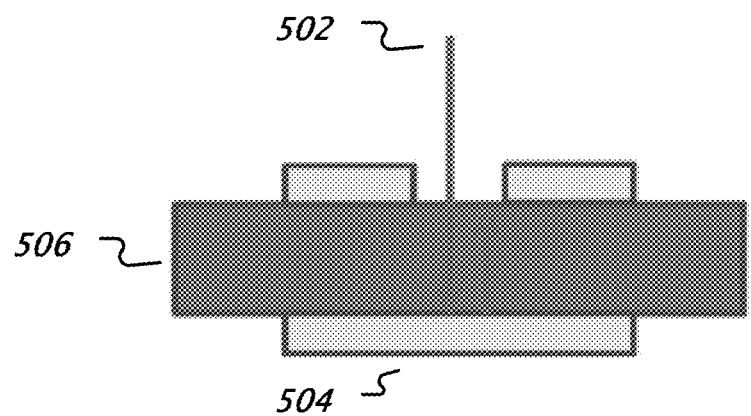
FIG. 5 shows an example configuration of a single axial switch used to allow propagation of incident and reflected light through the photoconductive material.

FIG. 5 shows an example configuration of a single axial switch used with the same light source. A blanket bottom metal contact 504 comprising a metal that is highly reflective at the light wavelength(s), such as silver (Ag), can be used in contact with the SiC substrate 506, such that the light 502 reflects back up through the switch for two passes. In some embodiments, the highly reflective bottom contact also improves reliability of the switch because such bottom contact absorbs a very small amount of light, mitigating degradation problem caused by excessive heating with high intensity light. Depending on the dimensions of the metal contacts and the wavelength of the light, in some embodiments, the light may be completely absorbed after two passes.

Figure 6:
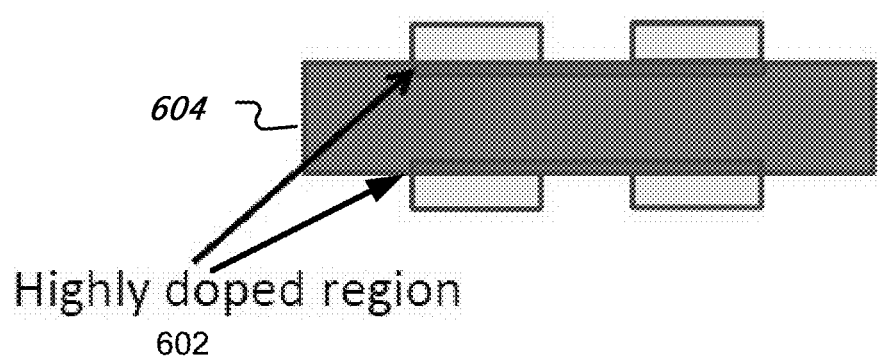
FIG. 6 shows an example configuration of an axial switch with a highly doped region.

FIG. 6 shows an example configuration of an axial switch with a highly doped region. The highly doped region provides more conductive surface area to collect the current. The highly conductive and transparent layer 602 can be formed on the surface of the SiC substrate 604, for example, by diffusion or ion implantation and activation of dopants such as P, N, B, Al or others. Alternately, the conductive and transparent layer 602 can be formed by the growth of a similar layer, or by growth of another transparent material that is highly conductive such as GaN, ITO, IGZO, IZO, Graphene, or others. Such layer 602 can further be formed by reaction of a metal such as Ni to create a highly conductive region.

Figure 7:
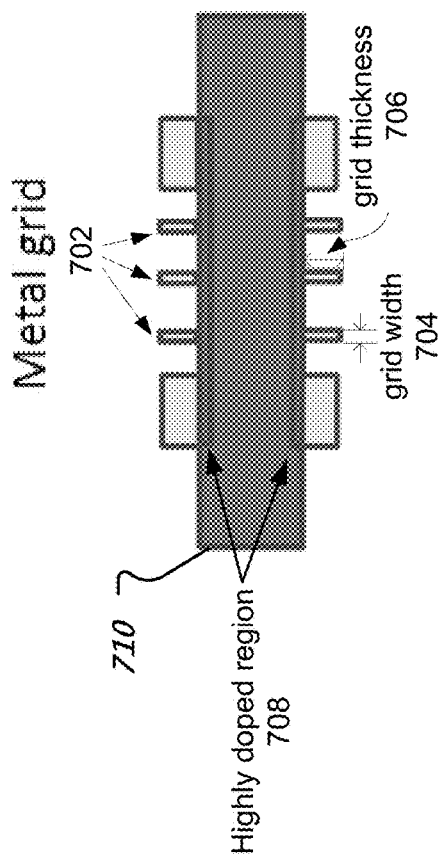
FIG. 7 shows an example configuration of an axial switch with metal grids.
Figures 12A, 12B:
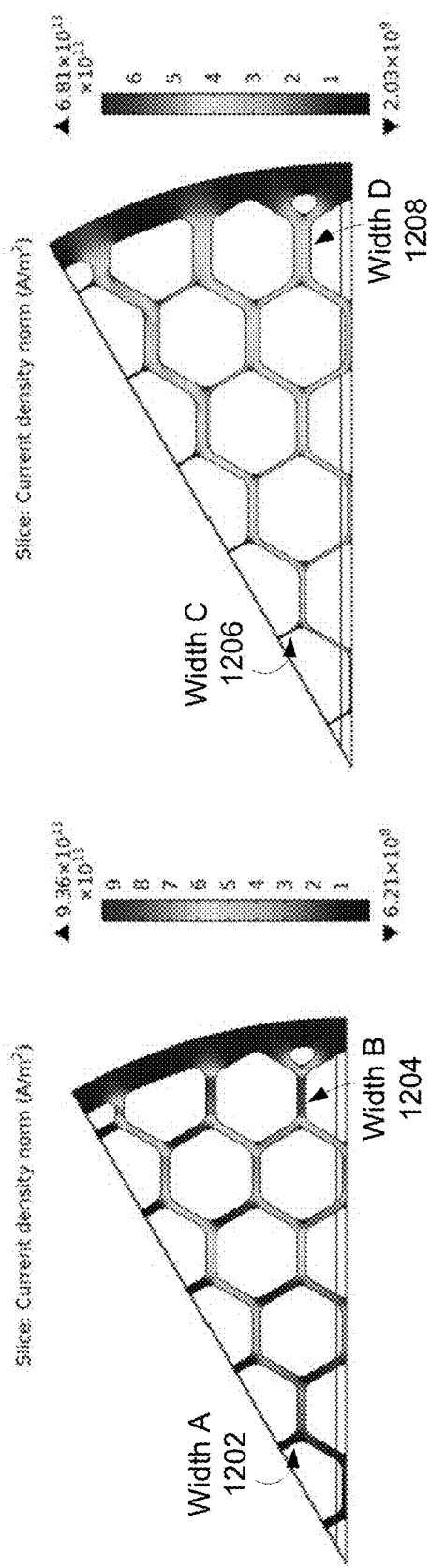
FIG. 12A shows a left grid with uniform width.
FIG. 12B shows a modified grid with varying widths.

FIG. 7 shows a side view of an example configuration of an axial switch with metal grids. A metal grid 702 can be present on the top side, bottom side, or both, such that the total metal perimeter that collects the current is increased relative to the opening, thus decreasing current constriction and resistive heating. In some embodiments, the metal grid includes grid elements having a grid width 704 of tens of µm and a grid thickness 706 of 100 nm to 10 µm. A top view of a section of the metal grid is also shown in FIGS. 12A-12B. In some embodiments, a highly doped region 708 can be formed on the top, bottom, or both surfaces of the substrate 710. In other embodiments, such highly doped region is optional.

Figure 8:
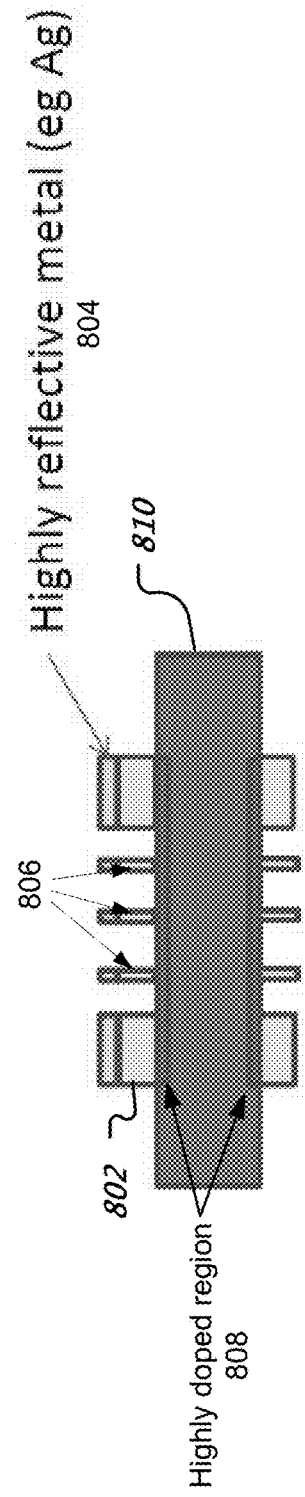
FIG. 8 shows an example configuration of an axial switch with metal grids and high reflectance metal layers.

To reduce absorption of light in the metal grid, highly reflective metal can be used in some embodiments of the switch. FIG. 8 shows an example configuration of an axial switch with a metal grid and a highly reflective metal surface. As shown in FIG. 8, the top metal contact 802 and the top metal grid 806 are covered by with a highly reflective top metal layer 804, comprising material such as Ag or Al, so that absorption of light in the metal grid is reduced, thus avoiding excessive heating that leads to reliability problems for the switch. Similarly, in some embodiments, a highly doped region 808 can be formed on top, bottom, or both surfaces of the substrate 810. In other embodiments, such highly doped region is optional.

Figure 9:
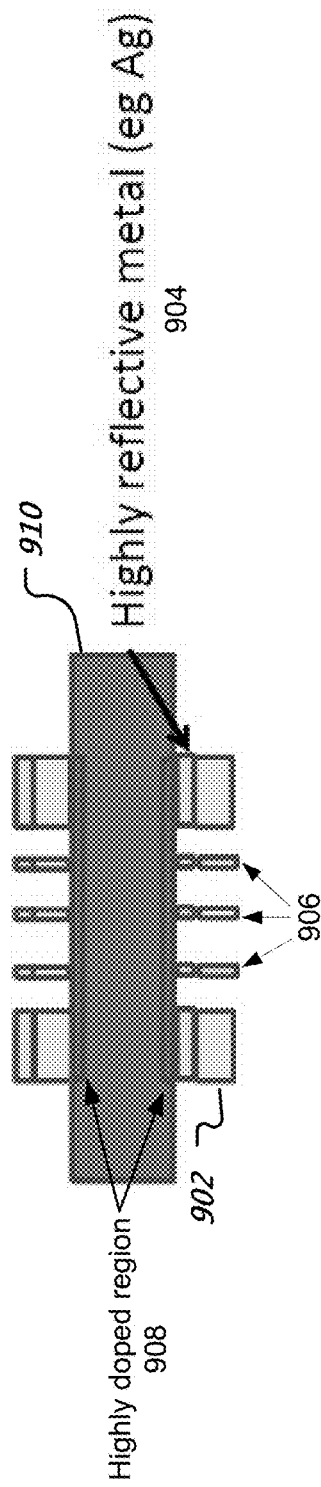
FIG. 9 shows an example configuration of an axial switch with reflective metal layers on both top and bottom contacts.

FIG. 9 shows another example configuration of an axial switch with reflective metals. A bottom metal grid 906 includes a highly reflective metal layer 904 positioned between the bottom metal grid and the substrate 910, as well as between the remaining sections of the bottom metal contact 902 and the substrate 910. The highly reflective metal layer can include material such as Ag or Al to reduce the absorption of light. In some embodiments, a highly doped region 908 can be formed on top, bottom, or both surfaces of the substrate 810. In other embodiments, such highly doped region is optional.

Plasma or chemical treatment of the area between the metal contact and the photoconductive switch can also improve Ohmicity of the contacts and reduce resistive heating. In some embodiments, such plasma or chemical treatment is conducted for the first few atomic layers of the photoconductive material. Exposing the surface to various plasmas or chemicals is one way to change the contact resistance. In some embodiments, the plasma or chemical treatment is used in combination with highly reflective metals (such as the highly reflective layer that is shown in FIG. 9) to form a layer with low contact resistance and low light absorption rate that further improve reliability for the switch.

Figure 10:
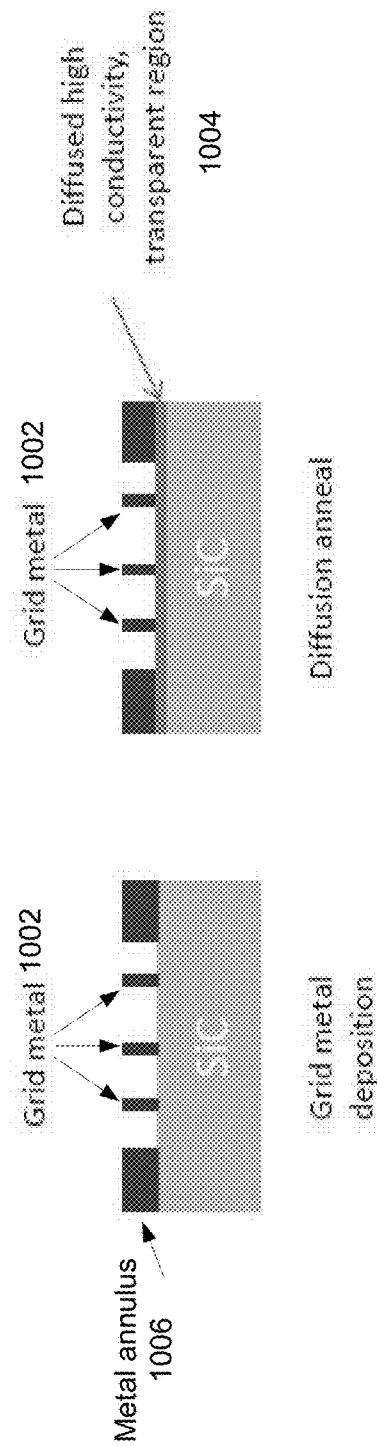
FIG. 10 shows an example configuration of an axial switch with a diffusion annealed region.

FIG. 10 shows another example configuration of an axial switch. In this configuration, a diffusion layer 1004 is formed below the metal grid 1002 and the metal annulus 1006 of the top electrode. Such a layer can include a material, such as Ni, that is diffused into the open areas of the grid at high temperatures. Inclusion of the diffused layer significantly increases the conductivity of grid without significantly affecting the transmission of light through the open areas of the grid.

Figure 11A:
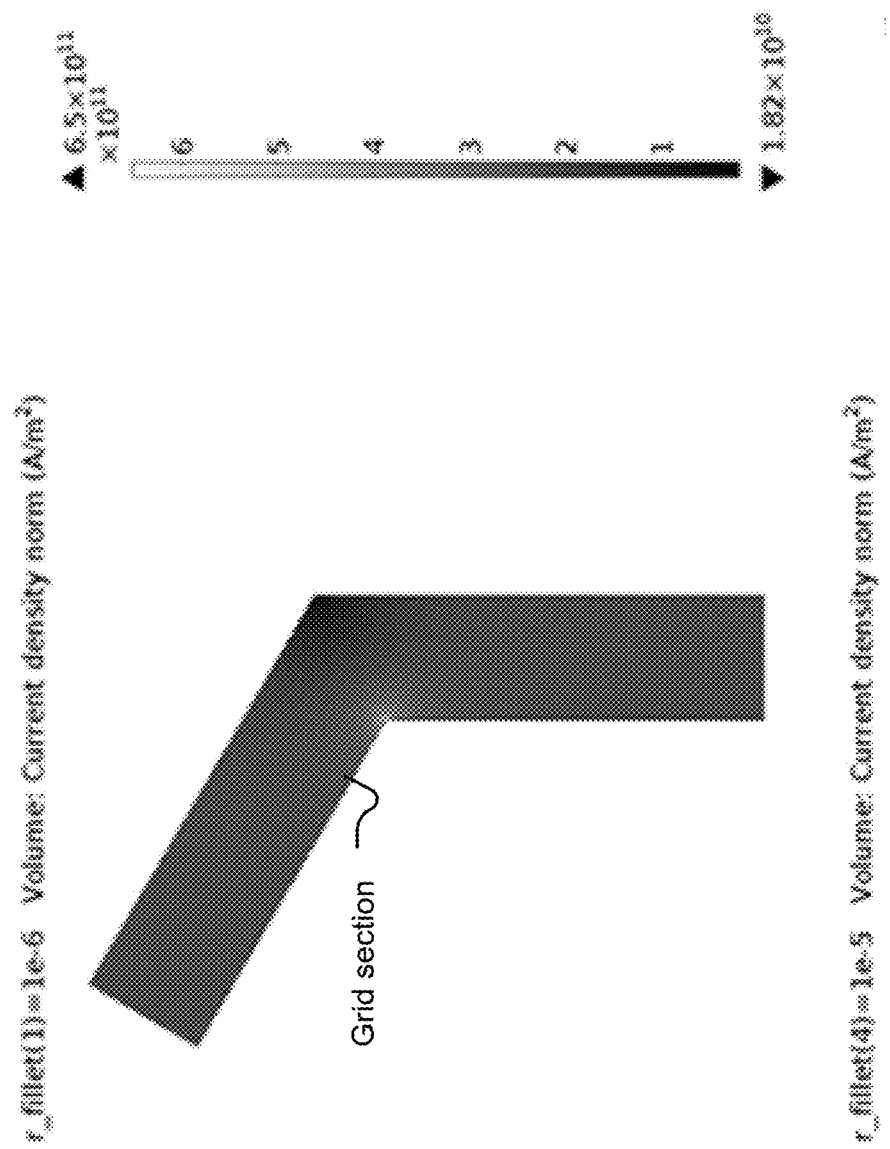
FIG. 11A shows a current density profile for a metal grid with radius of curvature of 1 μm.
Figure 11B:
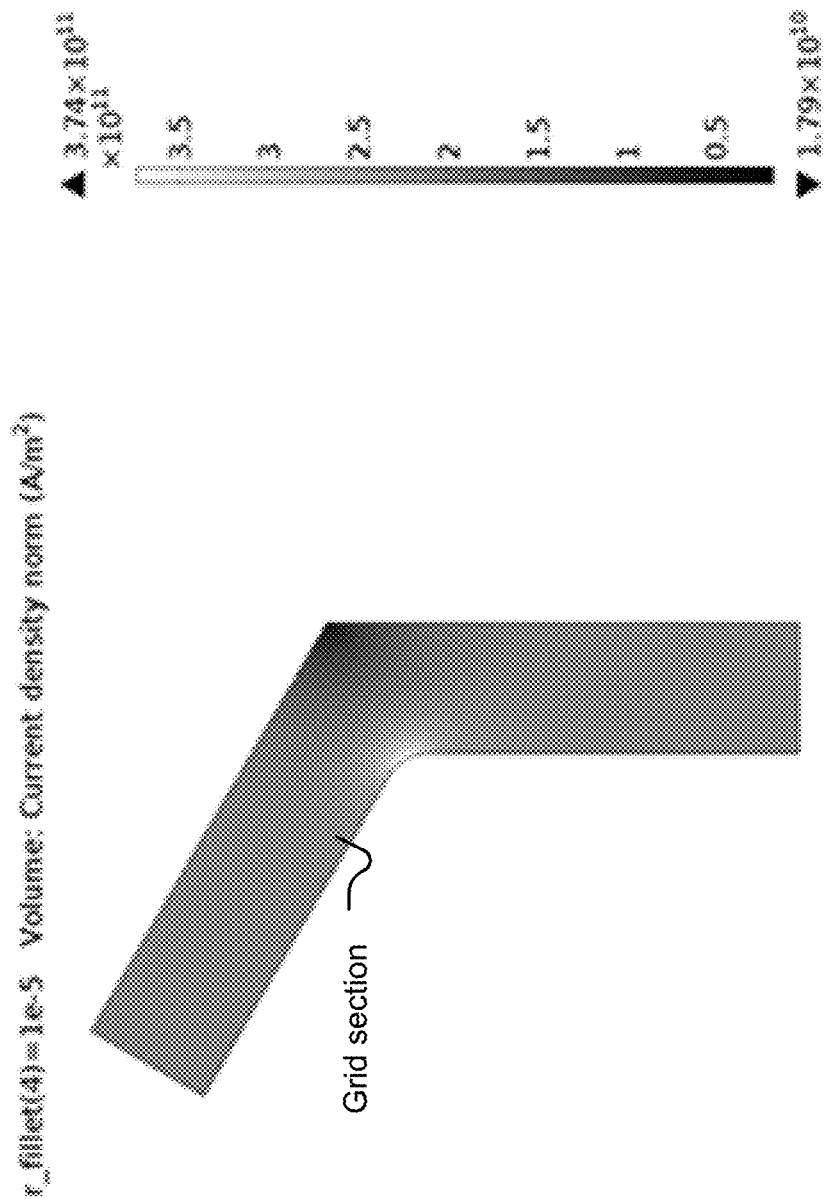
FIG. 11B shows a current density profile for a metal grid with radius of curvature of 10 μm.
Figure 11C:
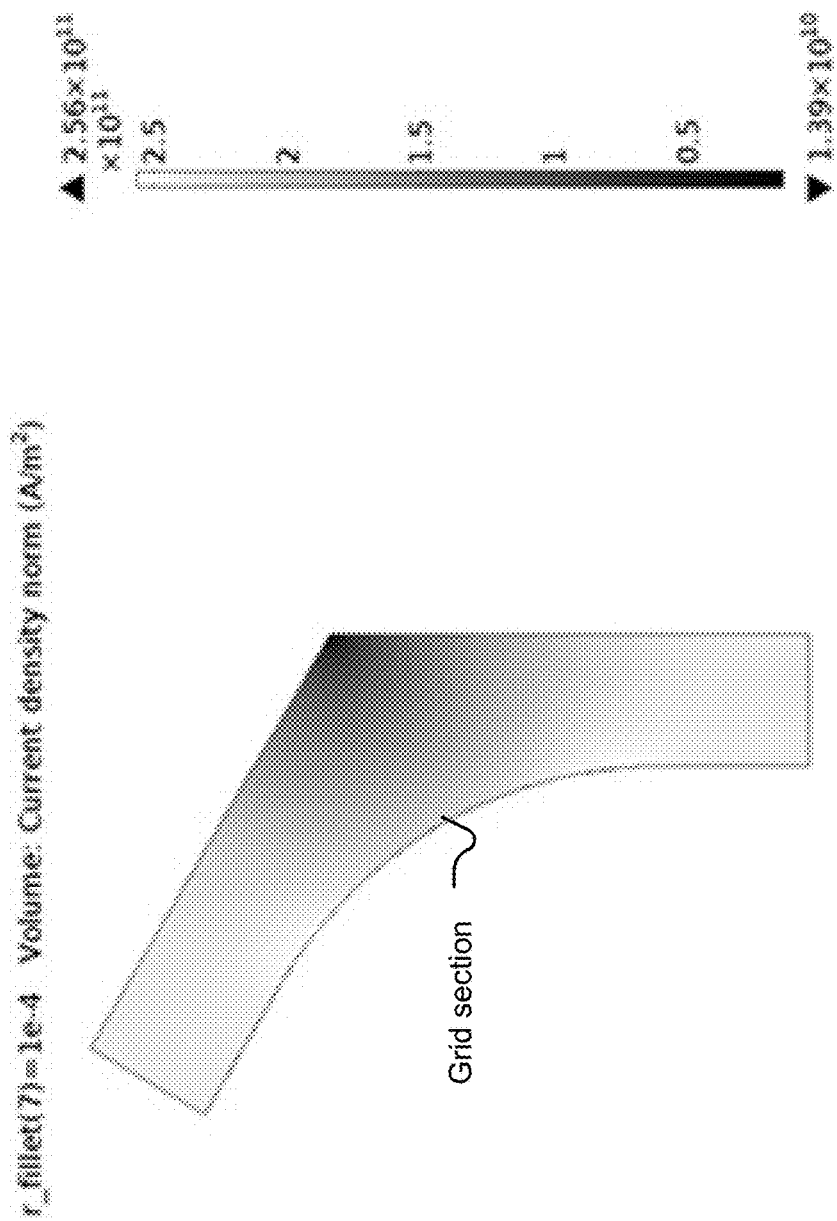
FIG. 11C shows a current density profile for a metal grid with radius of curvature of 100 μm.

In some embodiments, the axial switch is formed to include a metal grid having rounded bends such that current crowding and electro-migration are decreased. To illustrate this aspect of the disclosed embodiments, FIGS. 11A-11C show example plots of current density in a section of a metal grid, with applied bias of 0V and 1V. Three representative current density profiles for radii of curvature of 1, 10, and 100 μm for the inner sections of the depicted grids are shown in FIGS. 11A, 11B, and 11C respectively. As evident from these plots, the current density variations and magnitudes at the curved inner portions of the grid sections are decreased as the corresponding radii of curvature is increased. The decrease of current density with increasing radius of curvature provides an effective means for mitigating Joule heating and electro-migration effects, and improves the lifespan and reliability of the switch.

In some embodiments, metal grids with varying grid sizes are formed within the opening of the corresponding electrode or electrodes. In such embodiments, the current density distribution is made more uniform throughout the sections of the grid in order to reduce heating while maintaining the amount of open area for the light to pass through. FIGS. 12A-12B show current density plots in two example metal grids sections having the same total current, e.g. 1.1 kA, both with rounded corners with radius of curvature 30 μm. FIG. 12A shows a left grid with uniform width: width A 1202 (close to the center of the grid) equals to width B 1204 (near the outer edge of the grid). High current density can be observed in sections towards the edge of the device. FIG. 12B shows a modified grid with varying widths: width C 1206 (close to the center of the modified grid) is smaller than width D 1208 (near the outer edge of the modified grid). The overall current density becomes uniform in such modified grid.

Alignment of the metal grids also affects interaction of the incident light. FIG. 13 shows two example configurations of top and bottom metal grids. In one example configuration, the top and bottom metal grids are not aligned. This misalignment can cause undesirable interaction of incident light, such as light absorption by the bottom metal grid that can further introduce excessive heating in the switch. In another example configuration, the top and bottom metal grids are aligned. The alignment of grids reduces unnecessary interaction of incident light, such as light reflection or absorption by the bottom metal grid. In some embodiments that use various stacked configurations, grid alignment is particularly desirable because the alignment improves light transmission to subsequent switches.

Figure 14B:
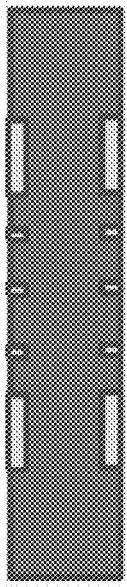
FIG. 14B shows metal deposition into such grooves.
Figure 14A:
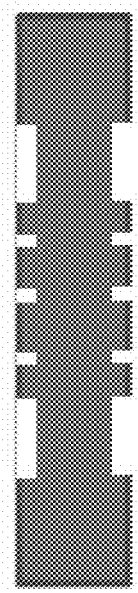
FIG. 14A shows the formation of grooves in the shape of metal contacts and metal grids.

FIGS. 14A-14B show yet another example configuration of the switch. As shown in FIG. 14A, grooves in the shape of the metal contacts (e.g. electrodes) and the metal grids are first formed on the surface of the SiC substrate. In FIG. 14B, metal is then deposited into the grooves to create a 3D electrode structure. The structure allows more surface area for the current to flow through and hence reduces current density and current constriction. In some embodiments, metal contacts and metal grids can be deposited into the grooves directly. Metal grids having small width and large thickness can be used. The small width of the grids allows light to pass through a larger fraction of the opening area, yet the large thickness of the grids provides more metal surface for collecting current.

Figure 15:
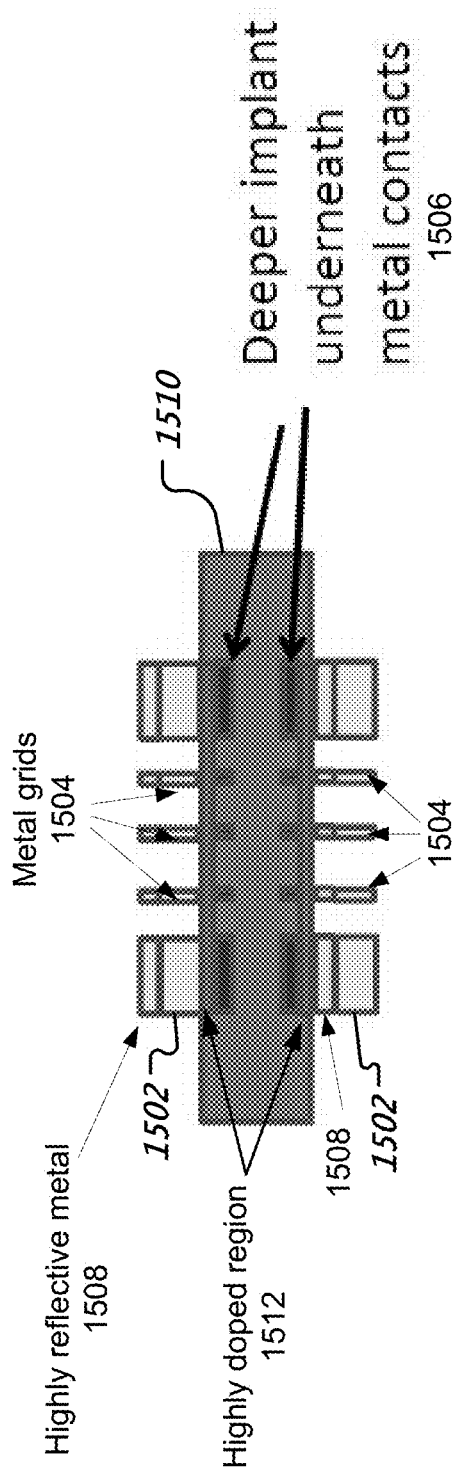
FIG. 15 shows an example configuration of an axial switch with high energy ion implantation.

An alternative embodiment uses high energy ion implantation to achieve larger area for current collection. FIG. 15 shows that high energy ion implantation region 1506 can be placed into the area beneath the metal contacts 1502 and the metal grids 1504. Similar to the metal-filled grooves illustrated in FIG. 14B, the high energy ion implantation region 1506 can also provide more conductive surface area for the current to flow through, hence reducing current density and current constriction. In some embodiments, such high energy ion implantation region 1506 can be combined with other disclosed configurations, such as in a configuration where a highly reflective metal layer 1508 is placed on the metal contacts and the metal grids to reduce the absorption of light. In some embodiments, a highly doped region 1512 can be formed on top, bottom, or both surfaces of the substrate 1510. The use of the highly reflective metal layer and the highly doped region is optional in some embodiments.

Figure 16:
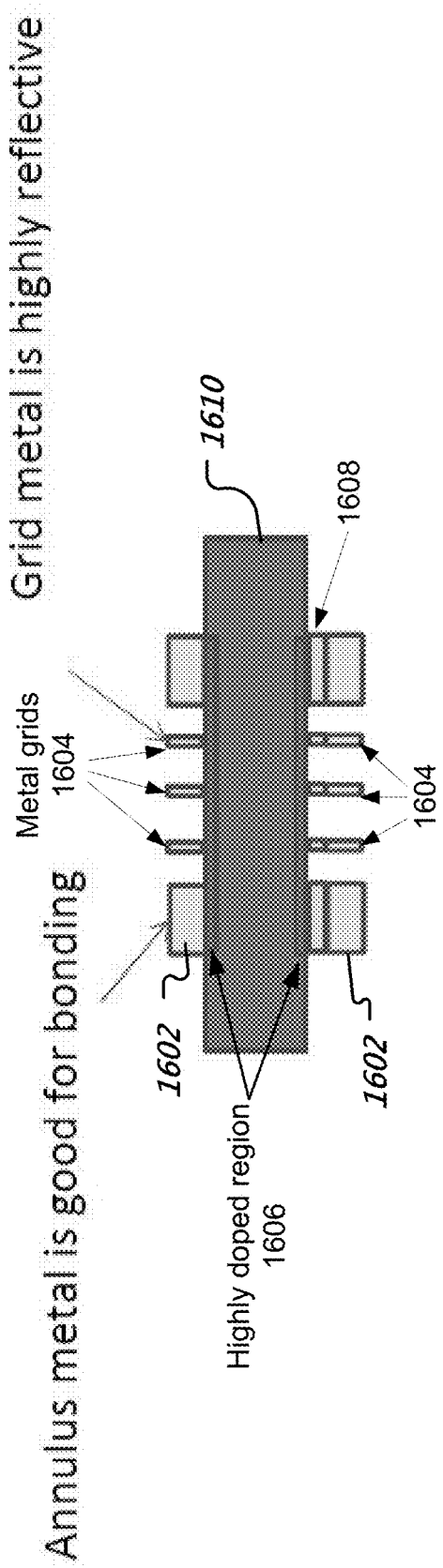
FIG. 16 shows an example configuration of an axial switch where the metal grid comprises a different metal than the remaining sections of the electrode.

FIG. 16 shows an example configuration of an axial switch where the metal grid comprises a different metal as compared to the remaining components of the electrode (e.g., the annulus). Packaging, transportation, and shipment can damage the surfaces of the metal contacts, and thus, in some embodiments, it is undesirable to use highly reflective metals to construct the metal contacts 1602. However, the metal grids 1604 may still comprise reflective metals to reduce light absorption and mitigate excessive heating with high intensity light. In one example configuration, there is no Au on metal grids 1604 while Au is used on other sections of the metal contact (e.g., on the annulus 1602) to improve packaging. Other disclosed configurations can be used in combination with this technique. For example, a highly reflective metal layer 1608 can be placed on the metal contacts and the metal grids to reduce the absorption of light. In some embodiments, a highly doped region 1608 can be formed on top, bottom, or both surfaces of the substrate 1610. The use of the highly reflective metal layer and the highly doped region is optional in some embodiments.

In some embodiments, dielectric coatings are used to facilitate efficient transmission of light into the SiC semiconductor material and to improve the lifespan and reliability of the switch components by encapsulating both the SiC material and the grid metal surfaces. Dielectric coatings over the opening of the metal contacts and the metal grids also improve anti-reflective properties and protect the coated metal surfaces from corrosion due to exposure to the atmosphere. FIG. 17A shows a top view of an example configuration of a switch, comprising a metal contact 1702 in the shape of an annulus and a metal grid with hexagonal elements 1704. FIG. 17B shows a side view of an example configuration of dielectric coating for an axial switch illustrated in FIG. 17A. In this example configuration, the anti-reflective coating 1706 covers the entire area, including the annulus, the metal grid, and any remaining surface area of the photoconductive material 1708. The coating protects the metal contact and the metal grid from being oxidized (e.g., when the metal components are heated). In some embodiments, the dielectric coating covers only the metal contact and the photoconductive material. FIG. 17C shows an example plot of reflectivity in the open portion of the metal contact as a function of incident light wavelength, illustrating a relatively low reflectance across the photoconductive material. FIG. 17D shows an example plot of reflectivity over the metal grid as a function of wavelength, showing a higher reflectivity than on the photoconductive material. In this example, the metal contact and the metal grid comprise different materials, thus the dielectric coating demonstrates differences in measured reflectivity.

Figure 18:
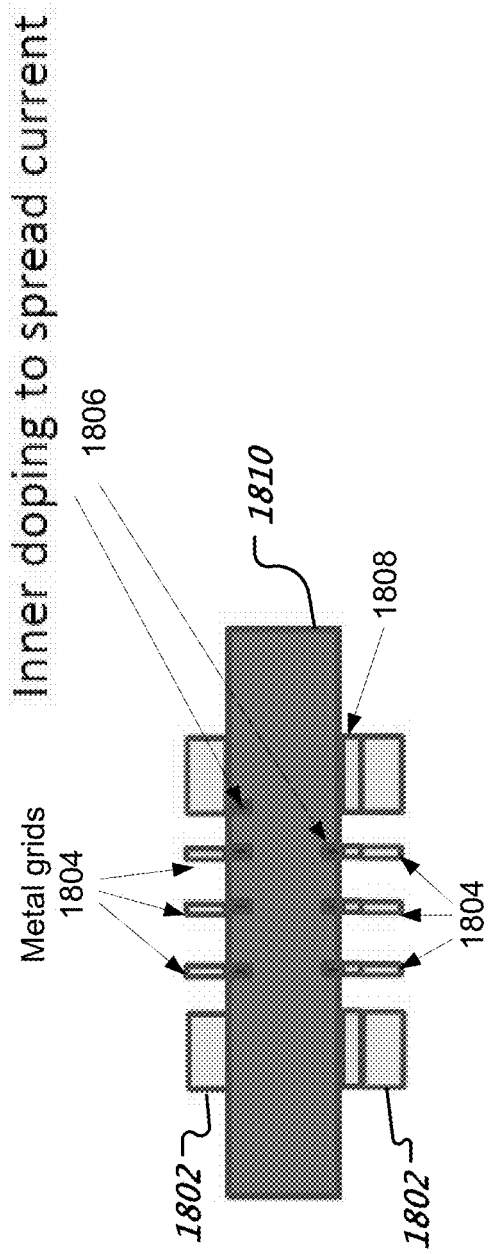
FIG. 18 shows an example configuration of an axial switch with a graded doping profile in proximity to the electrodes in order to spread the current.

FIG. 18 shows an example configuration in which an inner doping is used to spread current in an axial switch. Doping profile 1806 is used at inside edge of the metal grid 1804 and/or annulus region 1802 to improve the spread of current into the bulk material of the substrate in order to reduce current crowding. In some implementations, without a doped region that is positioned uniformly across the metal contacts and the metal grids (as shown in FIG. 6), the current tends to migrate to the corners or interfaces between the metal grid and the SiC substrate, or between the metal contact and the SiC substrate, forming hotspots for current density. Doping such regions and making them less conductive can spread the current out and reduce the occurrence of such hotspots, hence reducing current crowding. Other disclosed configurations can be used in combination with this technique. For example, in one embodiment, a highly reflective metal layer 1808 can be placed on the metal contacts and the metal grids to reduce the absorption of light. The use of the highly reflective metal layer is optional in some embodiments.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:
1. A photoconductive switch, comprising:
a first metal contact;
a photoconductive material;
a second metal contact, wherein the photoconductive material is placed between the first and the second metal contacts, the second metal contact comprising an opening to allow light to be coupled to the photoconductive material for activation of the photoconductive material; and
a highly conductive and transparent layer between the second metal contact and the photoconductive material.

2. The photoconductive switch of claim 1, wherein the second metal contact comprises a metal that is annealed at a high temperature to form an Ohmic contact on the photoconductive material.

3. The photoconductive switch of claim 2, wherein the Ohmic contact forms a conductive region in the photoconductive material to reduce current constriction.

4. The photoconductive switch of claim 1, wherein the first metal contact comprises a highly reflective metal layer positioned between at least a portion of the first metal contact and the photoconductive material to allow the light that passes through the photoconductive material to reflect back and pass through the photoconductive material for a second time.

5. The photoconductive switch of claim 1, further comprising a metal grid positioned within at least a section of the opening of the second metal contact, the metal grid including a plurality of regions that allow propagation of light therethrough.

6. The photoconductive switch of claim 5, further comprising a highly reflective metal layer positioned on a surface of the second metal contact or the metal grid that faces away from the photoconductive material to reduce absorption of the light by the second metal contact or the metal grid.

7. The photoconductive switch of claim 6, wherein the highly reflective metal layer and area beneath the second metal contact include improved Ohmicity due to exposure to plasma or chemical treatment.

8. The photoconductive switch of claim 5, wherein the metal grid includes curved bends.

9. The photoconductive switch of claim 5, wherein the metal grid includes multiple sections having non-uniform widths.

10. The photoconductive switch of claim 5, wherein the second metal contact and the metal grid are partially positioned within the photoconductive material.

11. The photoconductive switch of claim 5, further comprising a high energy ion implantation region positioned within the photoconductive material in contact with the metal grid and the second metal contact.

12. The photoconductive switch of claim 5, wherein the metal grid and the second metal contact comprise different materials.

13. The photoconductive switch of claim 5, further comprising an antireflection dielectric coating layer that covers (a) at least a surface of the second metal contact that faces away from the photoconductive material and (b) at least a section of the photoconductive material.

14. The photoconductive switch of claim 13, wherein the antireflection dielectric coating layer further covers at least a surface of the metal grid.

15. The photoconductive switch of claim 5, further comprising a doped region within the photoconductive material in the vicinity of the metal grid or at least a section of the second metal contact.

16. The photoconductive switch of claim 1, wherein the first metal contact comprises an opening to allow the light that propagates through the photoconductive material to exit.

17. The photoconductive switch of claim 16, wherein further including an additional photoconductive switch that is positioned in a stacked position with respect to the photoconductive switch such that the light that propagates through the photoconductive material and exits the opening of the first metal contact is coupled to the additional photoconductive switch.

18. The photoconductive switch of claim 16, further comprising an additional metal grid positioned within the opening of the first metal contact.

19. The photoconductive switch of claim 18, further comprising a highly reflective metal layer positioned on one side of the first metal contact or the additional metal grid.

20. The photoconductive switch of claim 18, wherein the additional metal grid includes sections with curved bends.

21. The photoconductive switch of claim 18, wherein the additional metal grid includes a plurality of sections having non-uniform widths.

22. The photoconductive switch of claim 18, wherein the metal grid and the additional metal grid are positioned within the openings of the second metal contact and the first metal contact, respectively, such that boundaries of one or more sections of the metal grid and the additional metal grid are aligned.

23. The photoconductive switch of claim 18, wherein the first metal contact and the additional metal grid are partially positioned within the photoconductive material.

24. The photoconductive switch of claim 18, further comprising a high energy ion implantation region positioned within the photoconductive material in contact with the additional metal grid and the first metal contact.

25. The photoconductive switch of claim 18, wherein the additional metal grid comprises a different metal than the first metal contact.

26. The photoconductive switch of claim 18, further comprising a doped region within the photoconductive material proximate to the additional metal grid.

27. A high power photoconductive axial switch, comprising:
    a light source to produce light;
    an electrical power supply to apply a high voltage;
    a top electrode coupled to the electrical power supply, comprising an opening to allow the light from the light source to enter the opening;
    a photoconductive material placed below the top electrode;
    a bottom electrode placed below the photoconductive material; and
    a highly conductive and transparent layer between the top electrode and the photoconductive material,
    wherein the photoconductive material exhibits an electrical conductivity change in response to the light to turn on or off the electrical path between the top electrode and the bottom electrode.

28. The high power photoconductive axial switch of claim 27, further comprising a metal grid positioned within at least a section of the opening of the top electrode, the metal grid including a plurality of regions that allow propagation of light therethrough.

* * * * *